United States Patent
Sakashita et al.

(10) Patent No.: US 12,188,118 B2
(45) Date of Patent: *Jan. 7, 2025

(54) POTASSIUM SODIUM NIOBATE SPUTTERING TARGET AND PRODUCTION METHOD THEREOF

(71) Applicant: JX Metals Corporation, Tokyo (JP)

(72) Inventors: Ryosuke Sakashita, Ibaraki (JP); Hiroshi Takamura, Ibaraki (JP); Atsushi Nara, Ibaraki (JP); Ryo Suzuki, Tokyo (JP)

(73) Assignee: JX ADVANCED METALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/384,430

(22) Filed: Oct. 27, 2023

(65) Prior Publication Data

US 2024/0052478 A1 Feb. 15, 2024

Related U.S. Application Data

(63) Continuation of application No. 16/956,056, filed as application No. PCT/JP2019/005478 on Feb. 15, 2019, now Pat. No. 11,851,747.

(30) Foreign Application Priority Data

Mar. 1, 2018 (JP) .................................. 2018-036786

(51) Int. Cl.
*C23C 14/34* (2006.01)
*C01G 33/00* (2006.01)
*C04B 35/495* (2006.01)
*H01J 37/34* (2006.01)

(52) U.S. Cl.
CPC ........ *C23C 14/3414* (2013.01); *C01G 33/006* (2013.01); *C04B 35/495* (2013.01); *H01J 37/3426* (2013.01); *C01P 2002/60* (2013.01); *C01P 2006/10* (2013.01); *C01P 2006/40* (2013.01); *C01P 2006/90* (2013.01)

(58) Field of Classification Search
CPC . C23C 14/3414; C23C 14/082; C23C 14/083; C23C 14/34; H01J 37/326; C01G 33/006; C04B 35/495; C04B 35/645; C04B 2235/6581; C04B 2235/663; C04B 2235/77; C04B 2235/786; C04B 2235/96; C04B 2235/3201; C04B 2235/5436; C01P 2002/60; C01P 2002/10; C01P 2002/40; C01P 2002/90
USPC ........................................ 204/298.12, 298.13
See application file for complete search history.

(56) References Cited

U.S. PATENT DOCUMENTS

| | | | |
|---|---|---|---|
| 11,851,747 B2 * | 12/2023 | Sakashita | C01G 33/006 |
| 2008/0066496 A1 | 3/2008 | Nagaya et al. | |
| 2012/0304429 A1 | 12/2012 | Horikiri et al. | |
| 2015/0229238 A1 | 8/2015 | Hirose et al. | |
| 2018/0265412 A1 | 9/2018 | Nara et al. | |

FOREIGN PATENT DOCUMENTS

| | | | |
|---|---|---|---|
| CN | 104557035 A | 4/2015 | |
| JP | 2000-313664 A | 11/2000 | |
| JP | 2004-059965 A | 2/2004 | |
| JP | 2008-270514 A | 11/2008 | |
| JP | 2011-236091 A | 11/2011 | |
| JP | 2012-167316 A | 9/2012 | |
| JP | 2014-033210 A | 2/2014 | |

OTHER PUBLICATIONS

R. Wang et al., "Fabrication and Characterization of Potassium-Sodium Niobate Piezoelectric Ceramics by Spark-Plasma-Sintering Method", Materials Research Bulletin, vol. 39, Issue 11, pp. 1709-1715, Jun. 2004.
Extended European Search Report issued in corresponding European Patent Application No. EP 19761276.5 on May 11, 2021.
K. Bakken, "Sintering of Lead-Free Piezoelectric Materials", Materials Science and Engineering, Jul. 2015.
Y. Su et al., "Comparative Study on Microstructure and Electrical Properties of (K0.5Na0.5)NbO3 Lead-Free Ceramics Prepared via Two Different Sintering Methods", J. Mater Sci, No. 52, pp. 2934-2943, 2017 (month unknown).

* cited by examiner

*Primary Examiner* — Rodney G McDonald
(74) *Attorney, Agent, or Firm* — Howson & Howson LLP

(57) ABSTRACT

A potassium sodium niobate sputtering target having a relative density of 95% or higher. A method of producing a potassium sodium niobate sputtering target, including the steps of mixing a $Nb_2O_5$ powder, a $K_2Co_3$ powder, and a $Na_2Co_3$ powder, pulverizing the mixed powder to achieve a grain size $d_{50}$ of 100 μm or less, and performing hot press sintering to the obtained pulverized powder in an inert gas or vacuum atmosphere under conditions of a temperature of 900° C. or higher and less than 1150° C., and a load of 150 to 400 $kgf/cm^2$. A high density potassium sodium niobate sputtering target capable of industrially depositing potassium sodium niobate films via the sputtering method is provided.

2 Claims, No Drawings

POTASSIUM SODIUM NIOBATE SPUTTERING TARGET AND PRODUCTION METHOD THEREOF

CROSS REFERENCE TO RELATED APPLICATIONS

This application is a continuation of co-pending U.S. application Ser. No. 16/956,056, which is a 371 National Stage of International Application No. PCT/JP2019/005478, filed Feb. 15, 2019, which claims the benefit under 35 USC 119 of Japanese Application No. 2018-036786, filed Mar. 1, 2018.

BACKGROUND

The present invention relates to a potassium sodium niobate sputtering target and to a method of producing such as a potassium sodium niobate sputtering target.

Lead-based PZT (lead zirconate titanate), which exhibits superior piezoelectric properties, is being used as the piezoelectric element for use in sensors and actuators. While PZT exhibits piezoelectric properties that are favorable and stable, the environmental burden is high due to the inclusion of lead, and its use is limited particularly in Europe due to the RoHS (Restriction of Hazardous Substances) directive and the ELV (End-of Life Vehicles Directive) directive, as substances having high environmental loads. Thus, the challenge is to replace it with a non-lead-based (lead-free) substance as the piezoelectric material.

While various materials are being researched as an alternative substance, it is not easy to find a material which rivals the properties and stability of PZT, and currently PZT is still being used as a subject to a RoHS exemption. Under the foregoing circumstances, since it is said that potassium sodium niobate (KNN) exhibits piezoelectric properties that are relatively close to PZT, it is considered to be a lead-free alternative substance candidate of PZT. For example, Japanese Patent Application Publication No. 2014-33210 A discloses a piezoelectric body formed from potassium sodium niobate.

Specifically, Japanese Patent Application Publication No. 2014-33210 A discloses a piezoelectric body layer expressed with the compositional formula of $(K_aNa_{1-a})_xNbO_3$ ($0.1<a<1$, $1 \leq x \leq 1.2$). Moreover, Japanese Patent Application Publication No. 2014-33210 A describes that as needed potassium or sodium may be excessively added or other components may be added. As the production method of the foregoing piezoelectric body layer, Japanese Patent Application Publication No. 2014-33210 A describes applying a precursor solution having the composition of the foregoing compositional formula on a substrate, and annealing and crystallizing it to prepare a piezoelectric body (sol-gel method). As other methods, Japanese Patent Application Publication No. 2014-33210 A additionally describes the MOD method, the laser abrasion method, and the sputtering method.

SUMMARY

An embodiment of the present invention aims to provide a high density potassium sodium niobate sputtering target and a method of producing such as a potassium sodium niobate sputtering target.

An embodiment of the present invention provides a potassium sodium niobate sputtering target having a relative density of 95% or higher. The potassium sodium niobate sputtering target may have an average crystal grain size of 1 to 20 μm, and/or a flexural strength of 50 MPa or more, and/or a volume resistivity of less than 1000 Ωcm, and/or a variation (maximum value/minimum value) in the volume resistivity of less than 1.5; and/or a volume resistivity exceeding 500 kΩcm.

Moreover, an embodiment of the present invention additionally provides a method of producing a potassium sodium niobate sputtering target, wherein the method includes the steps of mixing a $Nb_2O_5$ powder, a $K_2Co_3$ powder, and a $Na_2Co_3$ powder, pulverizing the mixed powder to achieve a grain size $d_{50}$ of 100 μm or less, and performing hot press sintering to the obtained pulverized powder in an inert gas or vacuum atmosphere under conditions of a temperature of 900° C. or higher and less than 1150° C., and a load of 150 to 400 kgf/cm². The method may include the step of performing, after hot press sintering, vacuum heat treatment at 600° C. or higher and 900° C. or less, or performing HIP treatment at 800° C. or higher and 1150° C. or less. The method may include the step of performing, after hot press sintering, heat treatment in an oxygen atmosphere or an air atmosphere at a temperature of 550° C. or higher and 1000° C. or less.

According to an embodiment of the present invention, it is possible to produce a high density potassium sodium niobate sputtering target, and industrially deposit potassium sodium niobate films via the sputtering method.

DETAILED DESCRIPTION

Potassium sodium niobate is a material which exhibits piezoelectric properties that are relatively close to PZT, and is attracting attention as a non-lead-based piezoelectric ceramic material of a small environmental burden. When forming a piezoelectric body layer of potassium sodium niobate, known is a method of using a liquid-phase method, such as the sol-gel method, as described in Japanese Patent Application Publication No. 2014-33210 A. Meanwhile, the use of a gas phase method, such as the sputtering method, for preparing a piezoelectric body of potassium sodium niobite is also being considered.

The sputtering method is a technique of preparing a film having roughly the same composition as the composition ratio of the target by causing Ar ions to collide with a sputtering target and accumulating atoms and molecules, which configure the target, on an opposing substrate. By using the sputtering method, it is possible to strictly control the composition ratio and the film thickness of the film. When adopting this kind of sputtering method, a potassium sodium niobate sputtering target is required. Nevertheless, an industrially usable potassium sodium niobate sputtering target does not yet exist.

An oxide-based sputtering target is normally prepared by foremost preparing a sintered body by sintering a raw material powder, and then machining the sintered body into a target shape. Nevertheless, when attempting to prepare a sputtering target from a potassium sodium niobate sintered body, because the raw material is difficult to handle and because potassium sodium niobate has sintering resistance, it was difficult to prepare a high density target. Meanwhile, when a low density target is used, there was a problem in that numerous particles are generated during sputtering, and such a low density target could not be used industrially.

In light of the foregoing circumstances, the potassium sodium niobate sputtering target according to an embodiment of the present invention is characterized in having a relative density of 95% or higher. When the relative density is less than 95%, the strength of the target will deteriorate, and the target may become cracked or the number of particles may increase during sputtering, and this will lead to the deterioration in the film properties. Accordingly, in order to enable industrial use, the potassium sodium niobate sputtering target according to an embodiment of the present invention preferably has a relative density of 95% or higher, and more preferably 98% or higher. Moreover, a high density sintered body can suppress the generation of cracks and degranulation during the processing it into the target, and, even when performing high power sputtering, it becomes more difficult for the sputtering target to become cracked, and improvement in the deposition rate can be expected.

In an embodiment of the present invention, the relative density is calculated as follows. Foremost, the target is cut into samples of a predetermined size, and then the dimension and weight thereof are measured to calculate the measured density. Next, the measured density is divided by the theoretical density to calculate the relative density (%) (=measured density/theoretical density×100). Here, let it be that the theoretical density of potassium sodium niobate is 4.51 g/cm$^3$. Note that, while the theoretical density will change slightly depending on the ratio of K/Na, the relative density according to an embodiment of the present invention is calculated uniformly using the value of the foregoing theoretical density irrespective of the composition.

In an embodiment of the present invention, the average crystal grain size of the potassium sodium niobate sputtering target is preferably 1 to 20 μm. As a result of refining the structure, stable sputtering can be realized. Furthermore, since the sintered body before being processed into a target similarly has a fine structure, an effect is yielded in that cracks and degranulation do not occur easily during the processing of the sintered body into a target.

In an embodiment of the present invention, the average crystal grain size of the sputtering target is calculated by polishing the cut surface of the sputtering target, thereafter observing the structure with an electron microscope (magnification of 1000×), drawing 3 straight lines on the photograph of the structure (entire length L), counting the number of grains n which cut across these straight lines, and thereby calculating the average crystal grain size (L/n) (cutting method).

In an embodiment of the present invention, the flexural strength of the potassium sodium niobate sputtering target is preferably 50 MPa or more. By causing the sputtering target to have a high strength, it is possible to effectively prevent cracks and the like during the transport of the target or the mounting of the target on the device. The flexural strength is measured based on JISR1601:2008.

In an embodiment of the present invention, the volume resistivity in a sputter surface of the potassium sodium niobate sputtering target is preferably 1000 Ωcm or less. In the foregoing case, high-speed deposition via DC sputtering is possible. Meanwhile, in an embodiment of the present invention, the volume resistivity in a sputter surface of the potassium sodium niobate sputtering target may also exceed 500 kΩcm. In the foregoing case, low-speed deposition via RF sputtering is possible, and the film thickness can be controlled easily. Which volume resistivity should be selected can be determined based on the required process.

Moreover, in an embodiment of the present invention, when the volume resistivity in a sputter surface of the potassium sodium niobate sputtering target is 1000 Ωcm or less, the variation (maximum value/minimum value) in such in-plane volume resistivity is preferably less than 1.5, and more preferably 1.2 or less. Since the variation in the volume resistivity is related to the variation in the composition and structure, the variation in the volume resistivity being small implies that the composition and structure are uniform, and uniform composition and structure are able to improve the film uniformity.

In an embodiment of the present invention, the volume resistivity in a sputter surface and its variation are obtained as follows. Foremost, the volume resistivity of 9 locations (1 location at the center, 4 locations at ½ radius point in 90-degree intervals, and 4 locations at 3 cm inward from the outer circumference in 90-degree intervals) in a sputter surface (surface to face the substrate upon use) of a target (disk shape) was measured based on the DC four-point probe method, and the average value thereof was used as the volume resistivity. Moreover, from the volume resistivity measured at 9 locations described above, the maximum value/minimum value was calculated from the maximum value and the minimum value thereof, and used as the variation in the volume resistivity.

The potassium sodium niobate sputtering target according to an embodiment of the present invention is formed from an oxide sintered body containing potassium (K), sodium (Na) and niobium (Nb), and the content ratio of the respective components in the oxide is preferably caused to be Nb:K:Na=1.0:X:1−X (wherein X is 0.3≤X) in terms of atomic ratio. Even higher piezoelectric property can be obtained by causing the potassium (K) ratio to be 30% or higher.

Moreover, as disclosed in Japanese Patent Application Publication No. 2000-313664 A, a part of K or Na may be substituted with Li (alkali metal) or a part of Nb may be substituted with Ta of the same group or Cu in order to improve the piezoelectric properties. Moreover, so as long as the high density of the sputtering target (sintered body) can be maintained, other components (accessory components) such as Sb, Bi, Zr, Ti, Ba, Sr, and Ca may be added. By adding these accessory components (usually added in the form of oxides), since it may be possible to change the sintering temperature and improve the sinterability (improve the productivity), and because polarizability, Curie point, relative permittivity, mechanical quality factor and other piezoelectric properties may change, the accessory components to be added may be adjusted according to the intended properties for each actual use of the piezoelectric body.

The method of producing the potassium sodium niobate sputtering target according to an embodiment of the present invention is now explained.

Raw Material Powders

As the raw material powders, a $Nb_2O_5$ powder, a $K_2Co_3$ powder, and a $Na_2Co_3$ powder are prepared. Here, when the average grain size of the raw material powder (in particular, carbonate raw materials) is large (for instance, $d_{50}$ is approximately 1 μmm), because subsequent pulverization based on mixing/pulverization is difficult, it is desirable to perform pulverization treatment to the respective raw material powders before weighing.

Mixing, Pulverization

The $Nb_2O_5$ powder, the $K_2Co_3$ powder, and the $Na_2Co_3$ powder are weighed to attain Nb:K:Na=1.0:X:1−X (wherein X is 0.3≤x) in terms of atomic ratio. Here, because the foregoing carbonate raw materials particularly have high water absorption properties, they tend to deviate from the composition ratio during weighing due to the change in their state. Accordingly, for the carbonate raw materials, it is preferable to perform sufficient dewatering and drying, and weigh the powders in an inert gas atmosphere of Ar or $N_2$ as much as possible.

After weighing, the powders are mixed. These raw material powders have extremely strong cohesive properties, and, because there is a difference in the grain sizes between the $Nb_2O_3$ raw material and the carbonate raw material, pulverization and uniform mixing are difficult. Thus, in order to obtain a dense and uniform sintered body, hyperfine grinding and uniform mixing should be sufficiently performed using a mixer such as a ball mill (wet mixing) or an attritor (dry mixing).

In wet mixing, the media amount is determined according to the raw material amount after weighing, and one medium, or a combination of multiple mediums, having a media diameter of roughly φ1 mm to 15 mm is used. As the media material, alumina ($Al_2O_3$) or zirconia ($ZrO_2$) may be used. As the dispersive medium, water or ethanol is used, and, when water is used, the entire amount of the mixed slurry should be collected upon extracting the same. Moreover, the mixing time shall be 5 hours or longer, and the pot is rotated at 60 rpm or faster.

In dry mixing, the media amount is determined according to the amount of the raw material powders in the same manner as wet mixing. As the media, alumina ($Al_2O_3$) or zirconia ($ZrO_2$) is used, and the mixing time is 30 minutes or longer. While dry mixing can be performed in a relatively short period of time, there is a drawback in that the yield upon collecting powder is inferior. Meanwhile, while wet mixing takes longer, there is an advantage in that the collection yield and uniformity are superior in comparison to dry mixing. Thus, it would be preferable to perform dry mixing and wet mixing separately or in combination according to the amount of raw material that is required.

By using this kind of pulverization method, mixing and pulverization are performed until the grain size $d_{50}$ (median size) becomes 100 μm or less. Using this kind of mixed powder having a small grain size as the sintering raw material powder is important in obtaining a dense sintered body (sputtering target).

Sintering

The mixed powder is filled in a graphite mold, and hot press sintering is performed in an inert gas or vacuum atmosphere at 900° C. or higher and less than 1150° C. Moreover, the load is set to be 150 kgf/cm² or more and 400 kgf/cm² or less. When the sintering temperature is less than 900° C., the density of the sintered body cannot be sufficiently increased. Meanwhile, when the sintering temperature is 1150° C. or higher, it will exceed the liquid phase appearance temperature of potassium niobate and cause the sintered body to melt. Moreover, when the load is less than 150 kgf/cm², the density of the sintered body cannot be sufficiently increased. Meanwhile, when the load exceeds 400 kgf/cm², the probability that cracks occur during sintering is increased.

Based on the above, it is possible to prepare a sintered body made from potassium sodium niobate having a relative density of 95% or higher, and, by setting the sintering temperature to 1000° C. or higher, the density can be further increased, and it is thereby possible to achieve a relative density of 98% or higher. As a production method other than hot press, a method of performing molding via CIP (cold isostatic pressing) or casting and thereafter performing atmospheric sintering, and subsequently performing vacuum heat treatment was also implemented, but with this method it was difficult to obtain a high density sintered body.

Moreover, by performing heat treatment to the foregoing potassium sodium niobate sintered body having a relative density of 95% or higher, it is possible to change the volume resistivity while maintaining the high density. When preparing a low resistance target, after hot press sintering, vacuum heat treatment is performed at 600° C. or higher and 900° C. or less or HIP (hot isostatic pressing) is performed at 800° C. or higher and 1150° C. or less. It is thereby possible to cause oxygen deficiency in a uniform manner, and obtain a sputtering target having a low resistance and with a minimal variation. Meanwhile, when preparing a high resistance target, after hot press sintering, heat treatment is performed in an oxygen atmosphere or an air atmosphere at a temperature of 550° C. or higher and 1000° C. or less. It is thereby possible to obtain a high resistance sputtering target.

Finish Processing

After cutting the ends of the thus obtained potassium sodium niobate sintered body, the surface is polished and finish processing is performed to obtain a target shape. As described above, since the relative density of the sintered body is high at 95% or higher, there is an advantage in that cracks and degranulation do not occur easily during the processing of the target.

EXAMPLES

The present invention is now explained based on the Examples and Comparative Examples. These Examples are merely illustrative, and the present invention is not in any way limited based on these Examples. In other words, the present invention is limited only by the scope of its claims, and covers the various modifications other than the Examples included in the present invention.

Example 1-1 to Example 1-6

A $Nb_2O_5$ powder, a $K_2CO_3$ powder, and a $Na_2CO_3$ powder were weighed to attain Nb:K:Na=1.0:0.45:0.55 in terms of atomic ratio. Next, these powders and a $ZrO_2$ media were filled in a ball mill pot, ethanol was introduced as a dispersive medium, and the pot was thereafter rotated at 70 rpm to perform wet mixing for 5 hours. After drying, sieving was performed with a sieve having an aperture of 100 μm. Subsequently, these pulverized powders were respectively subject to hot press (HP) sintering in a vacuum or in an Ar atmosphere under the conditions of sintering temperature of 900, 1000, and 1050° C., and load of 200, 300, and 400 kgf/cm². Subsequently, the obtained sintered bodies were machined and finished to a sputtering target shape.

As a result of measuring the various properties of the thus obtained potassium sodium niobate sputtering targets, high density sputtering targets having a relative density of 95% or higher were obtained in all cases. Moreover, these sputtering targets exhibited a fine structure in which the average crystal grain size was 20 μm or less, as well as a high strength in which the flexural strength was 50 MPa or more. The foregoing results are shown in Table 1.

TABLE 1

| | Production conditions | | | | | | | | Sputtering target (sintered body) | | |
|---|---|---|---|---|---|---|---|---|---|---|---|
| | Mixing | | | | | | | | | | |
| | ratio K:Na (atomic ratio) | Mixing condition | Grain size $d_{50}$ μm | Sintering conditions | Atmosphere | Maximum sintering ° C. | Load kgf/cm² | | Relative density % | Average grain size μm | Flexural strength MPa |
| Example 1-1 | 45:55:00 | Wet | 100 or less | H/P | Vacuum | 900 | 300 | | 96.1 | 2.5 | 59 |
| Example 1-2 | | | | | Vacuum | 1000 | 300 | | 98.4 | 3.4 | 67 |
| Example 1-3 | | | | | Vacuum | 1050 | 300 | | 99.2 | 14.5 | 63 |
| Example 1-4 | | | | | Ar | 1050 | 300 | | 99 | 13.8 | 70 |
| Example 1-5 | | | | | Vacuum | 1050 | 400 | | 98.9 | 11.2 | 68 |
| Example 1-6 | | | | | Vacuum | 1050 | 200 | | 98.1 | 16.4 | 62 |
| Example 1-7 | | Dry | 100 or less | H/P | Vacuum | 900 | 300 | | 96.5 | 3.3 | 60 |
| Example 1-8 | | | | | Vacuum | 1050 | 300 | | 98.9 | 14.1 | 64 |
| Example 1-9 | | | | | Ar | 1050 | 300 | | 99.1 | 14 | 65 |
| Example 1-10 | 50:50:00 | Wet | 100 or less | H/P | Vacuum | 1050 | 300 | | 98.2 | 12.5 | 62 |
| Example 1-11 | 40:60 | Wet | 100 or less | H/P | Vacuum | 1050 | 300 | | 99.3 | 18.8 | 69 |
| Example 1-12 | 60:40:00 | Wet | 100 or less | H/P | Vacuum | 1050 | 300 | | 95.9 | 10.4 | 51 |
| Comparative Example 1-1 | 45:55:00 | Wet | 100 or less | H/P | Vacuum | 800 | 300 | | 88.7 | — | — |
| Comparative Example 1-2 | | | | | | 1050 | 100 | | 94.3 | — | — |
| Comparative Example 1-3 | | | | | | 1150 | 300 | | Melted | — | — |
| Comparative Example 1-4 | | | | | | 1050 | 500 | | Cracked | — | — |
| Comparative Example 1-5 | | | 150 or less | H/P | Vacuum | 1050 | 300 | | 94.5 | — | — |
| Comparative Example 1-6 | 45:55:00 | Wet | 100 or less | Atmospheric sintering | Air atmosphere | 1050 | — | | 92.4 | 4.5 | — |

Example 1-7 to Example 1-9

A $Nb_2O_5$ powder, a $K_2CO_3$ powder, and a $Na_2CO_3$ powder were weighed to attain a predetermined atomic ratio (Nb:K:Na=1.0:0.45:0.55). Next, these powders and a $ZrO_2$ media were filled in a ball mill pot, and the pot was thereafter rotated at 60 to 100 rpm to perform dry mixing for 30 minutes. After drying, sieving was performed with a sieve having an aperture of 100 μm. Subsequently, these pulverized powders were respectively subject to hot press (HP) sintering in a vacuum or in an Ar atmosphere under the conditions of sintering temperature of 900, and 1050° C., and load of 300 kgf/cm². Subsequently, the obtained sintered body was machined and finished to a sputtering target shape.

As a result of measuring the various properties of the thus obtained potassium sodium niobate sputtering targets, as shown in Table 1, high density sputtering targets having a relative density of 95% or higher were obtained in all cases. Moreover, these sputtering targets exhibited a fine structure in which the average crystal grain size was 20 μm or less, as well as a high strength in which the flexural strength was 50 MPa or more. The foregoing results are shown in Table 1.

Example 1-10 to Example 1-12

A $Nb_2O_5$ powder, a $K_2CO_3$ powder, and a $Na_2CO_3$ powder were respectively weighed to attain predetermined atomic ratios (Nb:K:Na=1.0:0.50:0.50, Nb:K:Na=1.0:0.4:0.6, Nb:K:Na=1.0:0.6:0.4). Next, these powders and a $ZrO_2$ media were filled in a ball mill pot, ethanol was introduced as a dispersive medium, and the pot was thereafter rotated at 70 rpm to perform wet mixing for 5 hours. After drying, sieving was performed with a sieve having an aperture of 100 μm. Subsequently, the pulverized powders were subject to hot press (HP) sintering in a vacuum under the conditions of sintering temperature of 1050° C., and load of 300 kgf/cm². Subsequently, the obtained sintered bodies were machined and finished to a sputtering target shape.

As a result of measuring the various properties of the thus obtained potassium sodium niobate sputtering targets, high density sputtering targets having a relative density of 95% or higher were obtained in all cases. Moreover, these sputtering targets exhibited a fine structure in which the average crystal grain size was 20 μm or less, as well as a high strength in which the flexural strength was 50 MPa or more. The foregoing results are shown in Table 1.

Comparative Example 1-1

A $Nb_2O_5$ powder, a $K_2CO_3$ powder, and a $Na_2CO_3$ powder were weighed to attain a predetermined atomic ratio (Nb:K:Na=1.0:0.45:0.55). Next, these powders and a $ZrO_2$ media were filled in a ball mill pot, ethanol was introduced as a dispersive medium, and the pot was thereafter rotated at 70 rpm to perform wet mixing for 5 hours. After drying, sieving was performed with a sieve having an aperture of 100 μm. Subsequently, the pulverized powder was subject to hot press (HP) sintering in a vacuum under the conditions of sintering temperature of 800° C., and load of 300 kgf/cm². Subsequently, the obtained sintered body was machined and finished to a sputtering target shape. As a result of measuring the density of the thus obtained potassium sodium niobate sputtering target, the relative density was 88.7%.

Comparative Example 1-2

A $Nb_2O_5$ powder, a $K_2CO_3$ powder, and a $Na_2CO_3$ powder were weighed to attain a predetermined atomic ratio (Nb:K:Na=1.0:0.45:0.55). Next, these powders and a $ZrO_2$ media were filled in a ball mill pot, ethanol was introduced as a dispersive medium, and the pot was thereafter rotated at 70 rpm to perform wet mixing for 5 hours. After drying, sieving was performed with a sieve having an aperture of 100 μm. Subsequently, the pulverized powder was subject to hot press (HP) sintering in a vacuum under the conditions of sintering temperature of 1050° C., and load of 100 kgf/cm². Subsequently, the obtained sintered body was machined and finished to a sputtering target shape. As a result of measuring the density of the thus obtained potassium sodium niobate sputtering target, the relative density was 94.3%.

Comparative Example 1-3

A $Nb_2O_5$ powder, a $K_2CO_3$ powder, and a $Na_2CO_3$ powder were weighed to attain a predetermined atomic ratio (Nb:K:Na=1.0:0.45:0.55). Next, these powders and a $ZrO_2$ media were filled in a ball mill pot, ethanol was introduced as a dispersive medium, and the pot was thereafter rotated at 70 rpm to perform wet mixing for 5 hours. After drying, sieving was performed with a sieve having an aperture of 100 μm. Subsequently, the pulverized powder was subject to hot press (HP) sintering in a vacuum under the conditions of sintering temperature of 1150° C., and load of 300 kgf/cm². Nevertheless, melted places were observed in the obtained sintered body.

Comparative Example 1-4

A $Nb_2O_5$ powder, a $K_2CO_3$ powder, and a $Na_2CO_3$ powder were weighed to attain a predetermined atomic ratio (Nb:K:Na=1.0:0.45:0.55). Next, these powders and a $ZrO_2$ media were filled in a ball mill pot, ethanol was introduced as a dispersive medium, and the pot was thereafter rotated at 70 rpm to perform wet mixing for 5 hours. After drying, sieving was performed with a sieve having an aperture of 100 μm. Subsequently, the pulverized powder was subject to hot press (HP) sintering in a vacuum under the conditions of sintering temperature of 1050° C., and load of 500 kgf/cm². Nevertheless, cracks were observed in the obtained sintered body.

Comparative Example 1-5

A $Nb_2O_5$ powder, a $K_2CO_3$ powder, and a $Na_2CO_3$ powder were weighed to attain a predetermined atomic ratio (Nb:K:Na=1.0:0.45:0.55). Next, these powders and a $ZrO_2$ media were filled in a ball mill pot, ethanol was introduced as a dispersive medium, and the pot was thereafter rotated at 60 to 100 rpm to perform wet mixing for 30 minutes. After drying, sieving was performed with a sieve having an aperture of 150 μm. Subsequently, the pulverized powder was subject to hot press (HP) sintering in a vacuum under the conditions of sintering temperature of 1050° C., and load of 300 kgf/cm². As a result of measuring the density of the thus obtained potassium sodium niobate sputtering target, the relative density was 94.5%.

Comparative Example 1-6

A $Nb_2O_5$ powder, a $K_2CO_3$ powder, and a $Na_2CO_3$ powder were weighed to attain a predetermined atomic ratio (Nb:K:Na=1.0:0.45:0.55). Next, these powders and a $ZrO_2$ media were filled in a ball mill pot, ethanol was introduced as a dispersive medium, and the pot was thereafter rotated at 70 rpm to perform wet mixing for 5 hours. After drying, sieving was performed with a sieve having an aperture of 100 μm. Subsequently, the pulverized powder was subject to atmospheric sintering in an air atmosphere at a sintering temperature of 1050° C. Subsequently, the obtained sintered body was machined and finished to a sputtering target shape. As a result of measuring the density of the thus obtained potassium sodium niobate sputtering target, the relative density was 92.4%.

Example 2-1 to Example 2-3

The potassium sodium niobate sintered body prepared in Example 1-3 was subject to vacuum heat treatment at 900° C. or HIP treatment at 1100° C. after hot press sintering. After heat treatment, the sintered body was machined and finished to a sputtering target shape. As a result of measuring the volume resistivity of the thus obtained potassium sodium niobate sputtering target, the volume resistivity was a low resistance at several Ωcm, and the variation thereof was also extremely small at less than 1.2. The foregoing results are shown in Table 2.

TABLE 2

|  | Sintering method | Sintering temperature ° C. | Heat treatment | Heat treatment temperature ° C. | Relative density % | Volume resistivity (average) Ωcm | Variation in volume resistivity max/min | DC sputtering |
|---|---|---|---|---|---|---|---|---|
| Example 2-1 | H/P | 1050 | Vacuum heating | 600 | 99.3 | 1.6 | 1.16 | possible |
| Example 2-2 |  |  | Vacuum heating | 900 | 99.7 | 1.1 | 1.09 | possible |
| Example 2-3 |  |  | HIP | 1100 | 99.7 | 2.3 | 1.19 | possible |
| Example 2-4 | H/P | 900 | None |  | 96.1 | 359 | 1.55 | possible |
| Example 2-5 |  | 1050 | None |  | 99.2 | 244 | 1.24 | possible |
| Example 2-6 | H/P | 1050 | Atmospheric annealing | 900 | 99.3 | 500k< | — | impossible |
| Example 2-7 |  |  | Oxygen annealing | 900 | 99.3 | 500k< | — | impossible |
| Comparative Example 2-1 | Atmospheric sintering | 1050 | None |  | 92.4 | 500k< | — | impossible |

Example 2-4

As a result of measuring the volume resistivity of the potassium sodium niobate sputtering target prepared in Example 1-1, as shown in Table 2, the volume resistivity was a low resistance at 359 Ωcm, but the variation thereof was 1.55.

Example 2-5

As a result of measuring the volume resistivity of the potassium sodium niobate sputtering target prepared in Example 1-3, as shown in Table 2, the volume resistivity was a low resistance at 244 Ωcm, and the variation thereof was small at less than 1.5.

Example 2-6 to Example 2-7

The potassium sodium niobate sintered body prepared in Example 1-3 was subject to heat treatment in an air atmosphere or an oxygen atmosphere at a temperature of 900° C. after hot press sintering. After heat treatment, the sintered body was machined and finished to a sputtering target shape. As a result of measuring the volume resistivity of the thus obtained potassium sodium niobate sputtering target, as shown in Table 2, the volume resistivity was a high resistance exceeding 500 kΩcm.

Comparative Example 2-1

By way of reference, as a result of measuring the volume resistivity of the potassium sodium niobate sputtering target prepared in Comparative Example 1-7, as shown in Table 2, the volume resistivity was a high resistance exceeding 500 kΩcm.

The sputtering target according to an embodiment of the present invention is formed from a potassium sodium niobate sintered body, and has a high density at a relative density of 95% or higher. As a result of sputtering this kind of a target, it is possible to perform deposition in which the generation of particles is suppressed. Because it is known that potassium sodium niobate (KNN) exhibits piezoelectric properties that are approximate to that of PZT, it is useful as a piezoelectric element such as a lead-free actuator or sensor as a substitute of PZT.

We claim:

1. A potassium sodium niobate sputtering target comprising, a relative density is 98% or higher, and a volume resistivity is exceeding 500 kΩcm, and a content ratio of potassium, sodium and niobium is Nb:K:Na=1.0:X:1−X, wherein X is 0.3≤X, in terms of atomic ratio, a flexural strength is 50 MPa or more, and an average crystal grain size is 1 to 20 μm.

2. A method of producing the potassium sodium niobate sputtering target according to claim 1, wherein the method includes the steps of mixing a $Nb_2O_5$ powder, a $K_2CO_3$ powder, and a $Na_2CO_3$ powder, pulverizing the mixed powder to achieve a grain size $d_{50}$ of 100 μm or less, performing hot press sintering to the obtained pulverized powder in an inert gas or vacuum atmosphere under conditions of a temperature of 900° C. or higher and less than 1150° C., and a load of 150 to 400 kgf/cm², and the step of performing, after hot press sintering, heat treatment in an oxygen atmosphere or an air atmosphere at a temperature of 550° C. or higher and 1000° C. or less.

* * * * *